US006146960A

United States Patent [19]

Chang

[11] Patent Number: 6,146,960

[45] Date of Patent: Nov. 14, 2000

[54] METHOD OF FORMING MIXED MODE DEVICES

[75] Inventor: Kuang-Yeh Chang, Taipei, Taiwan

[73] Assignee: United Microelectronics Corp., Hsinchu, Taiwan

[21] Appl. No.: 09/195,744

[22] Filed: Nov. 18, 1998

[51] Int. Cl.[7] ........................ H01L 21/20; H01L 21/8242; H01L 21/4763

[52] U.S. Cl. .......................... 438/393; 438/396; 438/239; 438/592; 438/240

[58] Field of Search .................................... 438/239, 240, 438/241, 250, 393, 592

[56] References Cited

U.S. PATENT DOCUMENTS

| | | | |
|---|---|---|---|
| 5,804,488 | 9/1998 | Shih et al. | 438/396 |
| 6,033,950 | 9/1998 | Chen et al. | 438/239 |

*Primary Examiner*—Charles Bowers
*Assistant Examiner*—Yennhu B. Huynh
*Attorney, Agent, or Firm*—Hickman Coleman & Hughes, LLP

[57] ABSTRACT

A method of forming mixed mode devices is provided. A field oxide layer is formed on the substrate to isolate active regions from each other. A gate oxide layer is formed on the substrate, positioned over the active regions. A first conductive layer, a silicide layer and a second conductive layer are formed on the field oxide layer and on the gate oxide layer. The second conductive layer is converted to an oxide layer as a dielectric layer of a capacitor by thermal oxidation. A third conductive layer is formed and defined on the dielectric layer to form an upper electrode of the capacitor. A anisotropic etching step is performed to remove a part of the dielectric layer, a part of the silicide layer and a part of the first conductive layer to complete the capacitor and to form a gate of a transistor.

17 Claims, 4 Drawing Sheets

204
208b
212b
206b
214a
212a
208a
206a
202
200

METHOD OF FORMING MIXED MODE DEVICES

BACKGROUND OF THE INVENTION

1. Field of the Invention

The invention relates in general to the fabrication of mixed mode devices, and more particularly to a method of simultaneously forming a gate on a gate oxide layer and forming a capacitor on a field oxide layer.

2. Description of the Related Art

A conventional fabrication process of mixed mode devices comprises forming a pad oxide layer and a silicon nitride layer on a provided substrate. Active regions for forming transistors are defined on the substrate. A part of the silicon nitride layer and a part of the pad oxide layer are removed to form a field oxide layer to isolate the active regions from each other. A first polysilicon layer is formed on the active regions and the field oxide layer. A part of the first polysilicon layer is removed to form a lower electrode positioned over the field oxide layer using a photoresist layer. The silicon nitride layer and the pad oxide layer positioned of the active regions are removed. A gate oxide layer is formed on the active regions by thermal oxidation. At the same time, an oxide layer is formed on the profile of the lower electrode. A conformal second polysilicon layer is formed on the substrate. A silicide layer is formed on the second polysilicon layer. A part of the silicide layer and a part of the second polysilicon layer are removed to form a gate of a transistor and an upper electrode. The gate is formed on the gate oxide layer. The lower electrode, the oxide layer and the upper electrode constitute a capacitor on the field oxide layer.

A drawback in the conventional method described above is that a portion of the second polysilicon layer as a spacer remains on the sidewall of the lower electrode of the capacitor. The remaining second polysilicon layer is called a "stringer". Since the material of the stringer is a conductor, an unexpected electric conduction is formed to cause shorts between the capacitor and other devices on the substrate.

Another drawback in the conventional method described above is that an additional step, such as an isotropic etching, is required to remove the stringer. The isotropic etching not only removes the stringer but also etches the gate oxide layer. The gate oxide layer may be removed to expose the substrate because a thickness of the gate oxide layer is only about 50–100 Å. Removing the gate oxide layer results in transistor failure.

Yet another drawback in the conventional method is that when performing the step of isotropic etching to remove the stringer, a part of the side-wall of the upper electrode and the oxide layer (inter-poly dielectric layer) between the upper electrode and the lower electrode are etched. Furthermore, the capacitance of the capacitor is controlled by a thickness of the inter-poly dielectric layer. Because the inter-poly dielectric layer is etched during performing the isotropic etching, the quality of the capacitor cannot be controlled because the thickness of the inter-poly dielectric layer is difficult to controlled.

FIGS. 1A to 1E are schematic, cross-sectional views showing a conventional process for forming a mixed mode device. In FIG. 1A, a field oxide layer 102 is formed on a provided substrate 100 to isolate active regions (not shown) on the substrate 100. A pad oxide layer 104 is formed on the active regions. A first polysilicon layer 106 is formed on the pad oxide layer 104 and on the field oxide layer 102 by chemical vapor deposition (CVD).

In FIG. 1B, a part of the first polysilicon layer 106 is removed to form a lower electrode 106*a* of a capacitor on the field oxide layer 102, using a photoresist layer (not shown).

In FIG. 1C, the pad oxide layer 104 is removed. A gate oxide layer 108 is formed on the active regions by thermal oxidation. An oxide layer 110 is formed on the surface of the lower electrode 106*a* when forming the gate oxide layer 108. A conformal second polysilicon layer 112 is formed over the substrate 100 by CVD.

In FIG. 1D, a silicide layer 114 is formed on the second polysilicon layer 112.

In FIG. 1E, according to a defined pattern of a photoresist layer, a part of the silicide layer 114 and a part of the second polysilicon layer 112 are removed to form an upper electrode of the capacitor and to form a gate of a transistor by anisotropic etching. The capacitor and the transistor constitute a mixed mode devices. The upper electrode consists of the second polysilicon layer 112*a* and silicide layer 114*a*. The gate consists of the second polysilicon layer 112*b* and silicide layer 114*b*.

However, a portion of the second polysilicon layer 112 remains to form a stringer 112*c* on the sidewall of the lower electrode during anisotropic etching. Since the stringer 112*c* is a conductor, the stringer 112 may conduct electrically with other devices to make the devices short. An isotropic etching step is performed to removed the stringer 112*c* but the lower electrode 112*a* and the second polysilicon layer 112*b* of the gate are etched at the same time. The isotropic etching step even etches the oxide layer 110 as a dielectric layer of the capacitor and the gate oxide layer 108 to destroy the transistor and to affect the quality of the capacitor.

SUMMARY OF THE INVENTION

It is therefore an object of the invention to provide an improved method of forming mixed mode device to prevent formation of the stringer on the side-wall of a lower electrode as in a conventional method, and further to prevent the failure of the mixed mode devices because of the stringer.

The invention achieves the above-identified objects by providing a method of forming mixed mode devices. A field oxide layer is formed on the substrate to isolate active regions from each other. A gate oxide layer is formed on the substrate positioned of the active regions. A first conductive layer, a silicide layer and a second conductive layer are formed on the field oxide layer and on the gate oxide layer. The second conductive layer is converted to an oxide layer as a dielectric layer of a capacitor by thermal oxidation. A third conductive layer is formed and defined on the dielectric layer to form an upper electrode of the capacitor. A anisotropic etching step is performed to remove a part of the dielectric layer, a part of the silicide layer and a part of the first conductive layer to complete the capacitor and to form a gate of a transistor.

BRIEF DESCRIPTION OF THE DRAWINGS

Another objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1A:
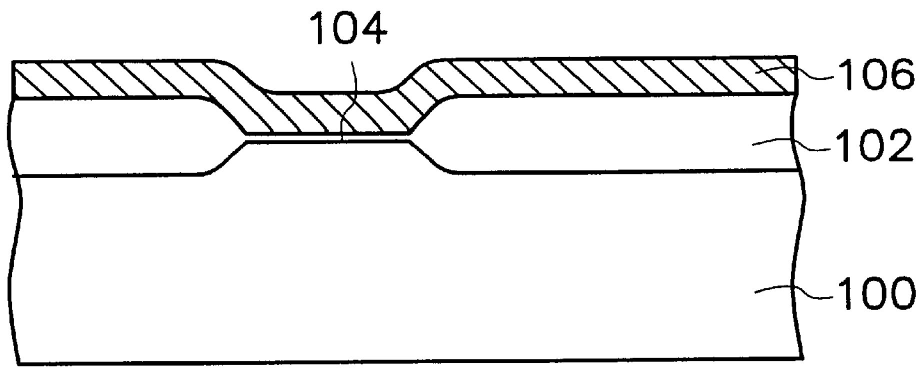
FIGS. 1A to 1E are schematic, cross-sectional views showing a conventional process of forming mixed mode devices.
Figure 1B:
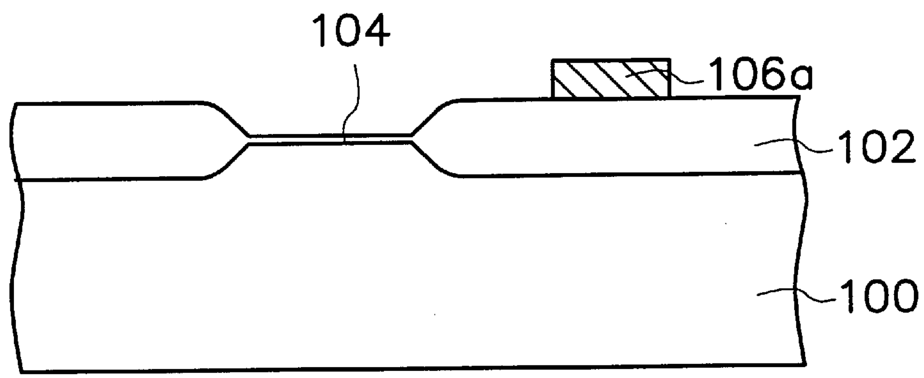
Figure 1C:
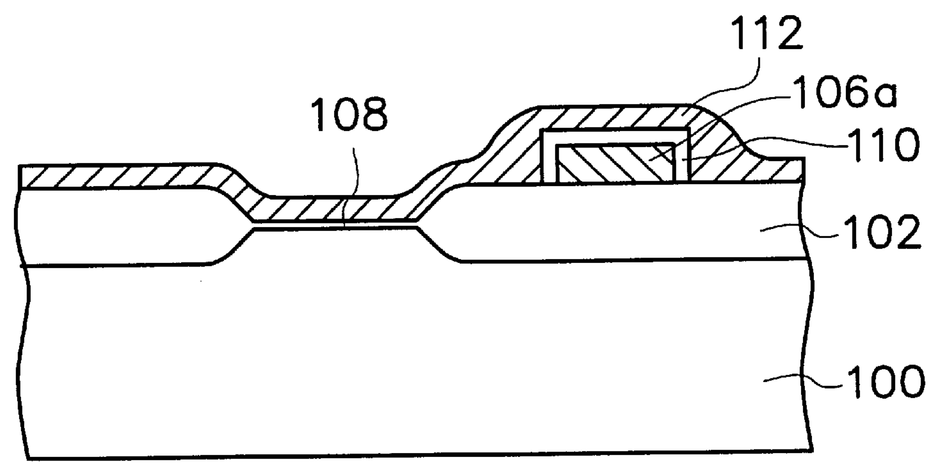
Figure 1D:
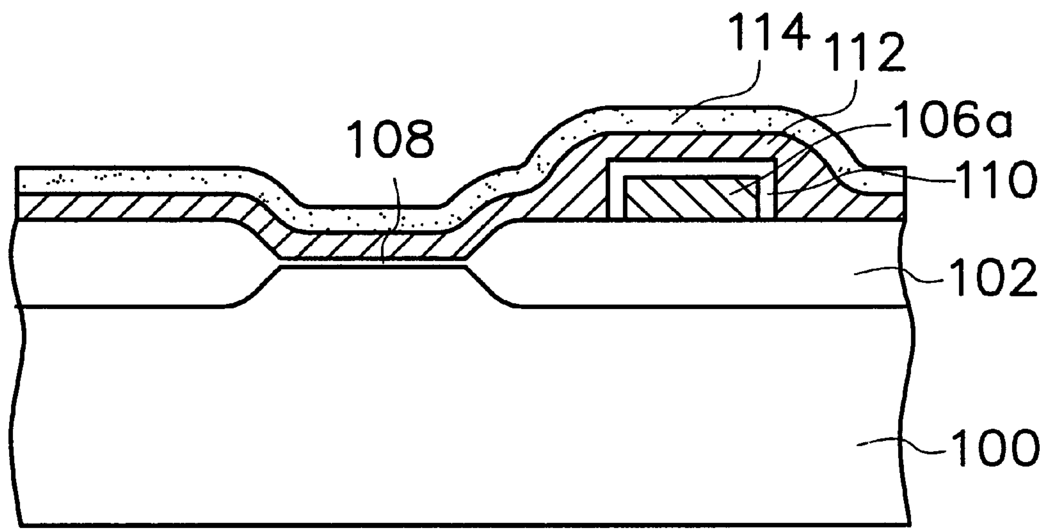
Figure 1E:
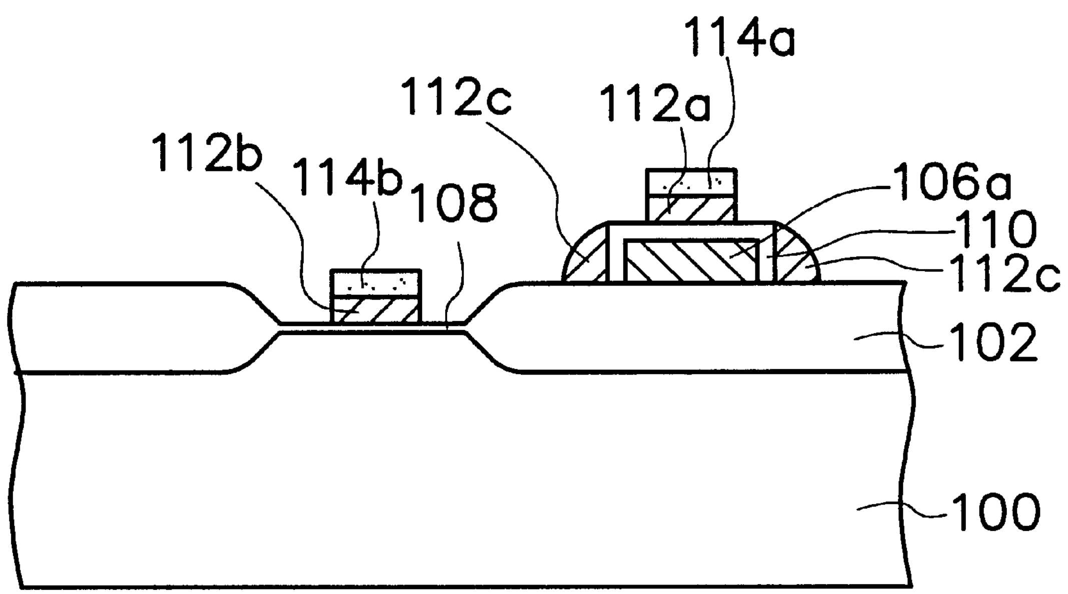
Figure 2A:
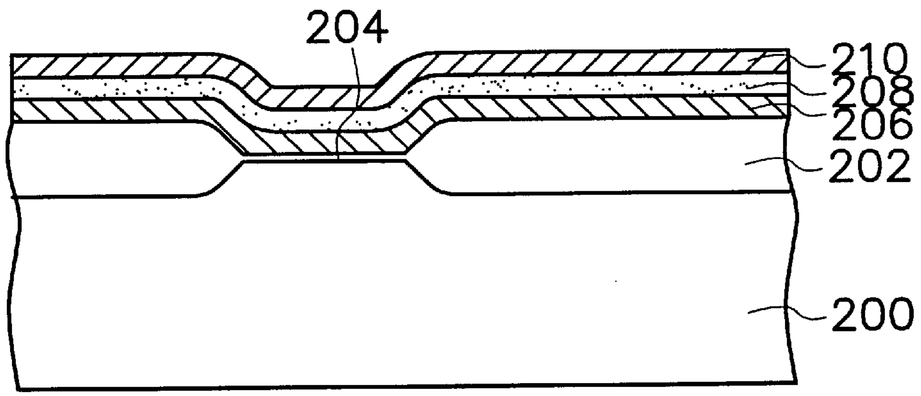
FIGS. 2A to 2E are schematic, cross-sectional views showing the process of one preferred embodiment of the method of forming mixed mode devices.

In FIG. 2A, a substrate 200 comprising a field oxide layer 202 and a gate oxide layer 204 thereon is provided. A first conductive layer 206, such as a polysilicon layer, is formed on the substrate 200. A silicide layer 208, such as a tungsten silicide layer, is formed on the first conductive layer 206. A second conductive layer 210, such as a polysilicon layer, is formed on the silicide layer 208. The thickness of the second conductive layer is about 200–250 Å. The first conductive layer 206, the silicide layer 208 and the second conductive layer 210 are formed, for example, by chemical vapor deposition (CVD).

Figure 2B:
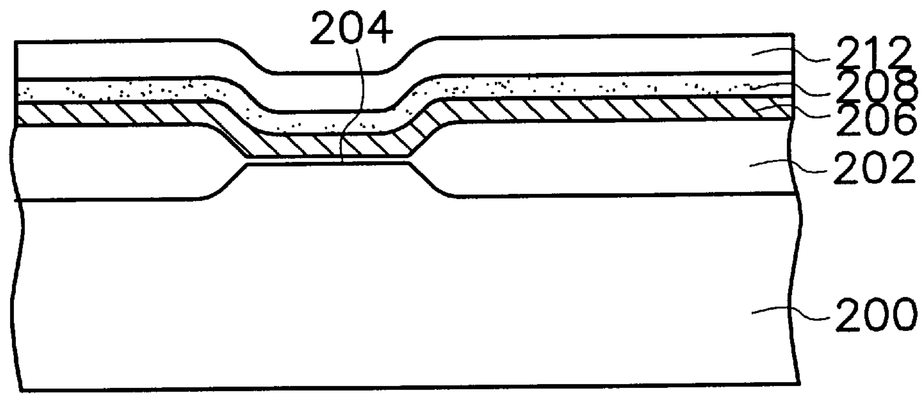

In FIG. 2B, the second conductive layer 210 is oxidized to form an oxide layer 212. The oxide layer 212 is used as a dielectric layer between a lower electrode and an upper electrode of a capacitor. The quality of the oxide layer 212 is important so that the preferred method to form the oxide layer 212 is thermal oxidation. A thickness of the oxide layer 212 is about 500–650 Å.

Figure 2C:
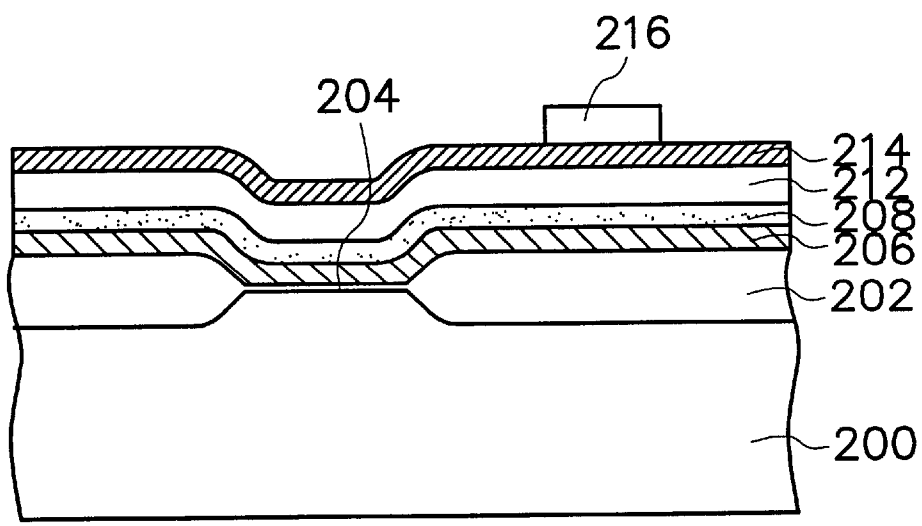

In FIG. 2C, a third conductive layer 214, such as a polysilicon layer, is formed on the oxide layer 212, for example, by CVD. A photoresist layer 216 is provided on the third conductive layer to define an upper electrode pattern.

Figure 2D:
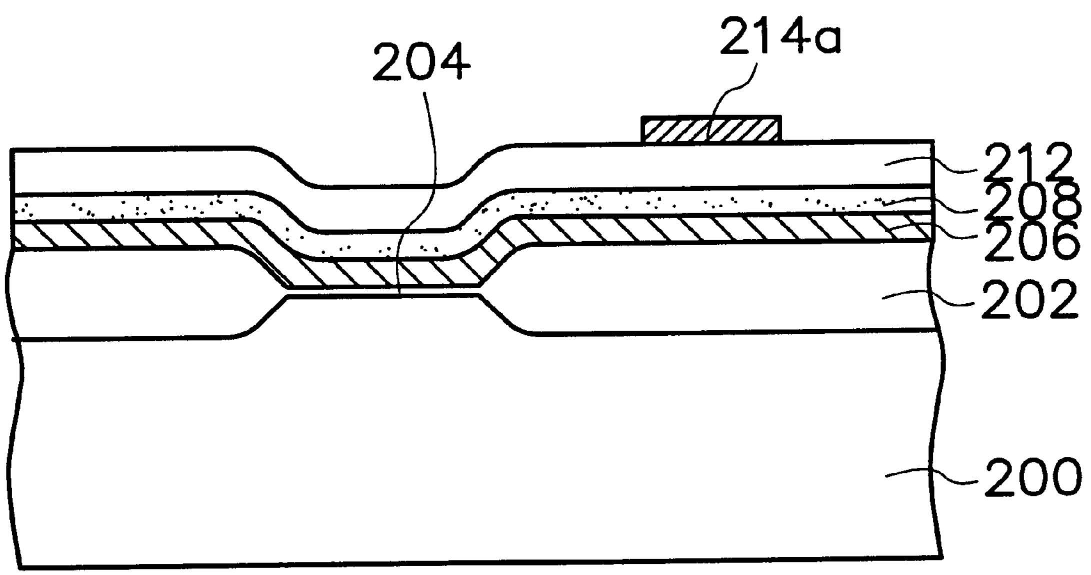

In FIG. 2D, a part of the third conductive layer 214 is removed, for example, by anisotropic etching. The remained third conductive layer 214*a* is used as the upper electrode of the capacitor. The photoresist layer 216 is removed.

Figure 2E:
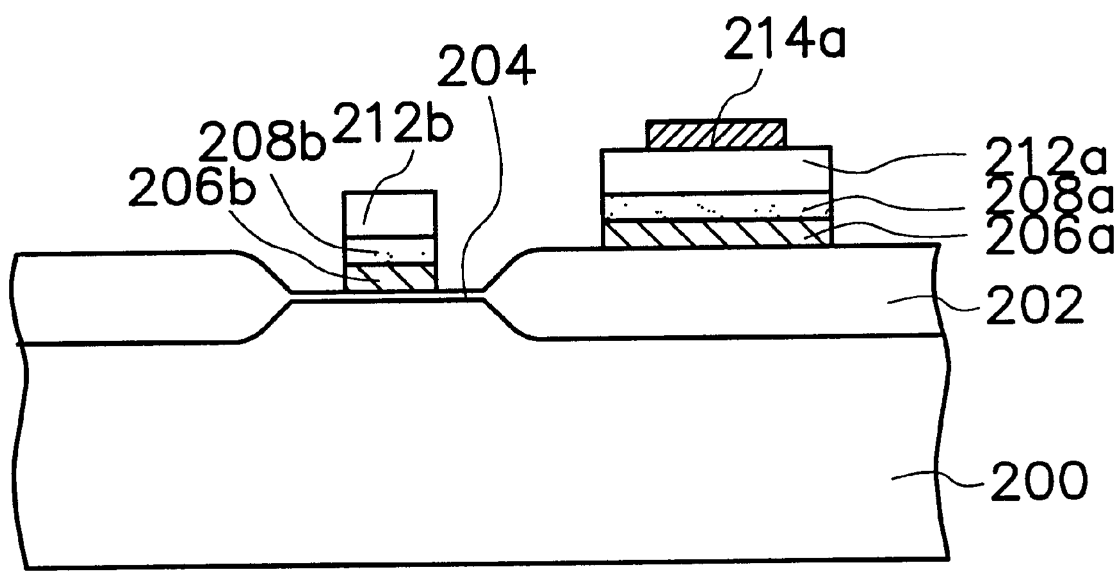

In FIG. 2E, a part of the oxide layer 212, a part of the silicide layer 208 and a part of the first conductive layer 206 are removed, for example, by anisotropic etching. The remaining silicide layer 208*a* and the remaining first conductive layer 206*a* compose the lower electrode of the capacitor. The lower electrode and the remaining oxide layer 212*a* are positioned over the field oxide layer 202. A remaining oxide layer 212*b*, a remaining silicide layer 208*b* and a remaining first conductive layer 206*b* are positioned over the gate oxide layer 204. The remaining first conductive layer 206*b* is used as a gate on the gate oxide layer 204. The size of the upper electrode is smaller than the size of the lower electrode so that the method of the invention requires two photoresist layers to define the lower electrode and the upper electrode.

A feature of the invention is that the first conductive layer, the silicide layer and the oxide layer are formed and defined to form the lower electrode on a plane surface. In the invention, there is no conformal structure, as seen in a prior technique so that no conductive layer remains to form stringer while performing an anisotropic etching step. The problem of unexpected electric conduction is thus avoided.

Another feature of the invention is that no stringer is formed during anisotropic etching so that an isotropic etching step is thus retrenched to prevent the failure of devices from isotropic etching. Since the thickness of the lower electrode and the thickness of the oxide layer are static, constant capacitance and high quality of the capacitor are obtained.

Yet another feature of the invention is that the gate oxide layer is not etched from performance of the isotropic etching step so that destruction of the transistor is avoided.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of forming mixed mode devices, comprising the steps of:

providing a substrate;

forming a field oxide layer on a part of the substrate;

forming a gate oxide layer on the other part of the substrate;

forming a first conductive layer on the gate oxide layer and on the field oxide layer;

forming a silicide layer on the first conductive layer;

forming a second conductive layer on the silicide layer;

oxidizing the second conductive layer to form an oxide layer on the silicide layer;

forming a third conductive layer on the oxide layer;

removing a part of the third conductive layer to form a upper electrode of a capacitor over the field oxide layer; and removing a part of the oxide layer, a part of the silicide layer and a part of the first conductive layer to form a lower electrode on the field oxide layer and to form a gate on the gate oxide layer.

2. The method according to claim 1, wherein a material of the first conductive layer comprises polysilicon.

3. The method according to claim 1, wherein a material of the second conductive layer comprises polysilicon.

4. The method according to claim 1, wherein a material of the third conductive layer comprises polysilicon.

5. The method according to claim 1, wherein the step of forming the second conductive layer is performed by chemical vapor deposition.

6. The method according to claim 1, wherein a thickness of the second conductive layer is about 200–250 Å.

7. The method according to claim 1, wherein the step of oxidizing the second conductive layer is performed by thermal oxidation.

8. The method according to claim 1, wherein the oxide layer has a thickness of about 500–650 Å.

9. The method according to claim 1, wherein the step of forming the third conductive layer is performed by chemical vapor deposition.

10. The method according to claim 1, wherein a material of the silicide layer comprises tungsten silicide.

11. A method of forming mixed mode devices, comprising the steps of:

providing a substrate, wherein the substrate at least comprises a field oxide layer and a gate oxide layer thereon;

forming a first polysilicon layer on the gate oxide layer and on the field oxide layer;

forming a silicide layer and a second polysilicon layer on the first polysilicon layer;

oxidizing the second polysilicon layer to form an oxide layer on the silicide layer;

forming an upper electrode of a capacitor positioned over the field oxide layer; and removing a part of the oxide layer, a part of the silicide layer and a part of the first polysilicon layer to form a lower electrode on the field oxide layer and to form a gate on the gate oxide layer.

12. The method according to claim 11, wherein the step of forming the second polysilicon layer is performed by chemical vapor deposition.

13. The method according to claim 11, wherein a thickness of the second polysilicon layer is about 200–250 Å.

14. The method according to claim 11, wherein the step of oxidizing the second polysilicon layer is performed by thermal oxidation.

15. The method according to claim 11, wherein the oxide layer has a thickness of about 500–650 Å.

16. The method according to claim 11, wherein the step of forming the third polysilicon layer is performed by chemical vapor deposition.

17. The method according to claim 11, wherein a material of the silicide layer comprises tungsten silicide.

* * * * *